(12) United States Patent
Kwon et al.

(10) Patent No.: US 10,170,304 B1
(45) Date of Patent: Jan. 1, 2019

(54) SELF-ALIGNED NANOTUBE STRUCTURES

(71) Applicant: GLOBALFOUNDRIES INC., Grand Cayman (KY)

(72) Inventors: Oh-Jung Kwon, Hopewell Junction, NY (US); Claude Ortolland, Garrison, NY (US); Dominic Schepis, Wappingers Falls, NY (US); Christopher Collins, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/793,621

(22) Filed: Oct. 25, 2017

(51) Int. Cl.
| | |
|---|---|
| *H01L 21/02* | (2006.01) |
| *H01L 29/06* | (2006.01) |
| *H01L 29/423* | (2006.01) |
| *H01L 29/786* | (2006.01) |
| *H01L 29/66* | (2006.01) |

(52) U.S. Cl.
CPC .. *H01L 21/02642* (2013.01); *H01L 21/02527* (2013.01); *H01L 21/02529* (2013.01); *H01L 21/02546* (2013.01); *H01L 21/02606* (2013.01); *H01L 29/0649* (2013.01); *H01L 29/0673* (2013.01); *H01L 29/42392* (2013.01); *H01L 29/66977* (2013.01); *H01L 29/78681* (2013.01); *H01L 29/78684* (2013.01); *H01L 29/78696* (2013.01)

(58) Field of Classification Search
CPC .............. H01L 29/0649; H01L 29/0673; H01L 29/42392; H01L 29/66977; H01L 29/78681; H01L 29/78684; H01L 29/78696
See application file for complete search history.

(56) References Cited

U.S. PATENT DOCUMENTS

| | | |
|---|---|---|
| 4,536,942 A | 8/1985 | Chao et al. |
| 4,551,905 A | 11/1985 | Chao et al. |
| 4,673,960 A | 6/1987 | Chao et al. |
| 4,954,307 A | 9/1990 | Yokoyama |
| 5,117,279 A | 5/1992 | Karpman |
| 5,133,921 A | 7/1992 | Yokoyama |
| 5,497,019 A | 3/1996 | Mayer et al. |
| 5,508,234 A | 4/1996 | Dusablon, Sr. et al. |
| 5,514,832 A | 5/1996 | Dusablon, Sr. et al. |
| 5,568,499 A | 10/1996 | Lear |
| 5,580,802 A | 12/1996 | Mayer et al. |
| 5,666,000 A | 9/1997 | Dusablon, Sr. et al. |
| 5,828,688 A | 10/1998 | Cook et al. |
| 5,909,614 A | 6/1999 | Krivoshlykov |
| 5,919,548 A | 7/1999 | Barron et al. |
| 5,943,558 A | 8/1999 | Kim et al. |
| 5,980,629 A | 11/1999 | Hansen et al. |
| 5,990,020 A | 11/1999 | Ha |
| 5,990,532 A | 11/1999 | Gardner |

(Continued)

*Primary Examiner* — Peniel M Gumedzoe
(74) *Attorney, Agent, or Firm* — Anthony Canale; Andrew M. Calderon; Roberts Mlotkowski Safran Cole & Calderon, P.C.

(57) ABSTRACT

The present disclosure generally relates to semiconductor structures and, more particularly, to self-aligned nanotube structures and methods of manufacture. The structure includes at least one nanotube structure supported by a plurality of spacers and an insulator material between the spacers and contacting the at least one nanotube structure.

20 Claims, 8 Drawing Sheets

(56) References Cited

U.S. PATENT DOCUMENTS

| | | | |
|---|---|---|---|
| 6,075,805 A | 6/2000 | Cook et al. |
| 6,205,488 B1 | 3/2001 | Casey et al. |
| 6,261,926 B1 | 7/2001 | King |
| 6,262,480 B1 | 7/2001 | Ferri et al. |
| 6,276,295 B1 | 8/2001 | Chen et al. |
| 6,312,976 B1 | 11/2001 | Lin et al. |
| 6,339,281 B2 | 1/2002 | Lee et al. |
| 6,391,782 B1 | 5/2002 | Yu |
| 6,445,122 B1 | 9/2002 | Chuang et al. |
| 6,448,709 B1 | 9/2002 | Chuang et al. |
| 6,486,599 B2 | 11/2002 | Wang et al. |
| 6,495,403 B1 | 12/2002 | Skotnicki et al. |
| 6,692,791 B2 | 2/2004 | Chang et al. |
| 6,759,746 B1 | 7/2004 | Davies |
| 6,765,881 B1 | 7/2004 | Rajakarunanayake |
| 6,823,462 B1 | 11/2004 | Cheng et al. |
| 6,829,709 B1 | 12/2004 | Acharya et al. |
| 6,830,954 B2 | 12/2004 | Williams |
| 6,838,319 B1 | 1/2005 | Williams |
| 6,863,516 B2 | 3/2005 | Williams |
| 7,081,030 B2 * | 7/2006 | Liu .................. B82Y 10/00 445/24 |
| 7,107,613 B1 | 9/2006 | Chen et al. |
| 7,147,534 B2 | 12/2006 | Chen et al. |
| 7,207,063 B1 | 4/2007 | Fluhrer |
| 7,253,060 B2 | 8/2007 | Yun et al. |
| 7,316,943 B2 | 1/2008 | Hara |
| 7,371,677 B2 | 5/2008 | Orlowski et al. |
| 7,389,534 B1 | 6/2008 | He |
| 7,463,580 B2 | 12/2008 | Agmon et al. |
| 7,508,039 B2 | 3/2009 | Al-Rabadi |
| 7,535,014 B2 | 5/2009 | Hsu et al. |
| 7,583,674 B2 | 9/2009 | Page |
| 7,590,725 B1 | 9/2009 | Harrison |
| 7,633,921 B2 | 12/2009 | Thubert et al. |
| 7,644,622 B2 | 1/2010 | Qiao et al. |
| 7,652,308 B2 | 1/2010 | Park et al. |
| 7,719,056 B2 | 5/2010 | Hamamoto |
| 7,771,117 B2 | 8/2010 | Kim et al. |
| 7,772,584 B2 | 8/2010 | Orlowski et al. |
| 7,774,837 B2 | 8/2010 | McAlister |
| 7,781,756 B2 | 8/2010 | Darsey et al. |
| 7,803,675 B2 | 9/2010 | Suk et al. |
| 7,811,848 B2 | 10/2010 | Barlocchi et al. |
| 7,843,918 B2 | 11/2010 | Osborne |
| 7,915,085 B2 | 3/2011 | Leung et al. |
| 7,919,338 B2 | 4/2011 | Hsu et al. |
| 7,923,315 B2 | 4/2011 | Pouydebasque et al. |
| 7,945,696 B2 | 5/2011 | Vasseur et al. |
| 7,961,725 B2 | 6/2011 | Nagarajan et al. |
| 7,981,715 B2 | 7/2011 | Robert |
| 7,984,369 B2 | 7/2011 | Sul et al. |
| 7,984,495 B1 | 7/2011 | Aravind |
| 7,995,500 B2 | 8/2011 | Vasseur |
| 7,995,558 B1 | 8/2011 | Meadows |
| 8,008,170 B2 | 8/2011 | Liang et al. |
| 8,038,795 B2 | 10/2011 | Barker et al. |
| 8,039,919 B2 | 10/2011 | Moon et al. |
| 8,040,797 B2 | 10/2011 | Vasseur et al. |
| 8,072,299 B2 | 12/2011 | Chen et al. |
| 8,074,270 B1 | 12/2011 | Lordello |
| 8,084,335 B2 | 12/2011 | Seddon et al. |
| 8,097,515 B2 * | 1/2012 | Bangsaruntip ......... B82Y 10/00 257/24 |
| 8,098,649 B2 | 1/2012 | Regan et al. |
| 8,105,890 B2 | 1/2012 | Sparks |
| 8,111,627 B2 | 2/2012 | McCallum et al. |
| 8,129,800 B2 | 3/2012 | Yun et al. |
| 8,134,220 B2 | 3/2012 | Manning et al. |
| 8,165,038 B2 | 4/2012 | Shaw et al. |
| 8,173,993 B2 | 5/2012 | Bangsaruntip et al. |
| 8,199,658 B2 | 6/2012 | Vasseur et al. |
| 8,248,187 B2 | 8/2012 | Chen et al. |
| 8,261,617 B2 | 9/2012 | Choi et al. |
| 8,316,226 B1 | 11/2012 | Kshirsagar et al. |
| 8,324,037 B1 | 12/2012 | Shih et al. |
| 8,324,728 B2 | 12/2012 | Tabrizi |
| 8,327,437 B2 | 12/2012 | McAlister |
| 8,354,721 B2 | 1/2013 | Xiao et al. |
| 8,360,575 B2 | 1/2013 | Feng et al. |
| 8,361,869 B2 | 1/2013 | Zhou et al. |
| 8,384,065 B2 | 2/2013 | Bangsaruntip et al. |
| 8,384,991 B2 | 2/2013 | Kieu et al. |
| 8,395,218 B2 | 3/2013 | Suk et al. |
| 8,398,410 B2 | 3/2013 | Yeh et al. |
| 8,410,870 B2 | 4/2013 | Chen et al. |
| 8,420,428 B2 | 4/2013 | Barlocchi et al. |
| 8,540,424 B2 | 9/2013 | Price |
| 8,540,922 B2 | 9/2013 | Sheehan et al. |
| 8,587,070 B2 | 11/2013 | Sparks |
| 8,609,481 B1 | 12/2013 | Franklin et al. |
| 8,634,292 B2 | 1/2014 | Vasseur et al. |
| 8,674,412 B2 | 3/2014 | Franklin et al. |
| 8,735,869 B2 | 5/2014 | Cappellani et al. |
| 8,741,756 B2 | 6/2014 | Franklin et al. |
| 8,794,582 B2 | 8/2014 | Feng et al. |
| 8,809,116 B2 | 8/2014 | Tabrizi |
| 8,817,364 B2 | 8/2014 | Kim et al. |
| 8,835,267 B2 | 9/2014 | Lee et al. |
| 8,835,993 B2 | 9/2014 | Yun et al. |
| 8,843,657 B2 | 9/2014 | Thubert et al. |
| 8,847,726 B2 | 9/2014 | Ikeda et al. |
| 8,884,441 B2 | 11/2014 | Hsueh et al. |
| 8,900,931 B2 | 12/2014 | Liang |
| 8,900,951 B1 | 12/2014 | Cheng et al. |
| 8,910,239 B2 | 12/2014 | Barton et al. |
| 8,914,845 B2 | 12/2014 | Barton et al. |
| 8,927,374 B2 | 1/2015 | Su et al. |
| 8,931,078 B2 | 1/2015 | Barton et al. |
| 8,942,238 B2 | 1/2015 | Kano |
| 8,944,789 B2 | 2/2015 | Butuc et al. |
| 8,969,934 B1 | 3/2015 | Cheng et al. |
| 9,000,499 B2 | 4/2015 | Franklin et al. |
| 9,000,530 B2 | 4/2015 | Balakrishnan et al. |
| 9,006,829 B2 | 4/2015 | Colinge et al. |
| 9,015,384 B2 | 4/2015 | Warren et al. |
| 9,023,723 B2 | 5/2015 | Chang et al. |
| 9,034,704 B2 | 5/2015 | Balakrishnan et al. |
| 9,064,943 B1 | 6/2015 | Anderson et al. |
| 9,076,813 B1 | 7/2015 | Lee et al. |
| 9,087,850 B2 | 7/2015 | Fujisawa et al. |
| 9,093,616 B2 | 7/2015 | Leung et al. |
| 9,095,873 B2 | 8/2015 | Price |
| 9,100,309 B2 | 8/2015 | Christodorescu et al. |
| 9,105,817 B2 | 8/2015 | Leung et al. |
| 9,106,536 B2 | 8/2015 | Christodorescu et al. |
| 9,123,567 B2 | 9/2015 | Radosavljevic et al. |
| 9,129,938 B1 | 9/2015 | Cheng et al. |
| 9,136,343 B2 | 9/2015 | Pillarisetty et al. |
| 9,139,427 B2 | 9/2015 | Behrendt et al. |
| 9,147,579 B2 | 9/2015 | Hiruta |
| 9,257,535 B2 | 2/2016 | Lee et al. |
| 9,263,274 B2 | 2/2016 | Fujisawa et al. |
| 9,263,520 B2 | 2/2016 | Liu et al. |
| 9,281,363 B2 | 3/2016 | Chen |
| 9,281,379 B1 | 3/2016 | Campi, Jr. et al. |
| 9,293,532 B2 | 3/2016 | Cheng et al. |
| 9,299,777 B2 | 3/2016 | Cheng et al. |
| 9,324,795 B2 | 4/2016 | Cheng et al. |
| 9,324,796 B2 | 4/2016 | Cheng et al. |
| 9,324,797 B2 | 4/2016 | Cheng et al. |
| 9,324,818 B2 | 4/2016 | Waldron et al. |
| 9,337,291 B2 | 5/2016 | Pillarisetty et al. |
| 9,349,656 B2 | 5/2016 | Yang et al. |
| 9,385,195 B1 | 7/2016 | Zhang |
| 9,397,159 B2 | 7/2016 | Ching et al. |
| 9,397,163 B2 | 7/2016 | Campi, Jr. et al. |
| 9,406,749 B2 | 8/2016 | Tai et al. |
| 9,412,828 B2 | 8/2016 | Ching et al. |
| 9,443,948 B2 | 9/2016 | Cheng et al. |
| 9,443,978 B2 | 9/2016 | Bae et al. |
| 9,466,610 B1 | 10/2016 | Yang |
| 9,466,699 B2 | 10/2016 | Guo et al. |
| 9,472,471 B1 | 10/2016 | Balakrishnan et al. |

(56) References Cited

U.S. PATENT DOCUMENTS

| | | | |
|---|---|---|---|
| 9,473,385 B2 | 10/2016 | Hinkle et al. | |
| 9,484,272 B2 | 11/2016 | Cappellani et al. | |
| 9,491,078 B2 | 11/2016 | Christodorescu et al. | |
| 9,496,256 B2 | 11/2016 | Wang et al. | |
| 9,496,338 B2 | 11/2016 | Chang et al. | |
| 9,502,507 B1 | 11/2016 | Akarvardar et al. | |
| 9,502,518 B2 | 11/2016 | Liu et al. | |
| 9,502,566 B2 | 11/2016 | Fenouillet-Beranger et al. | |
| 9,520,466 B2 | 12/2016 | Holland et al. | |
| 9,521,117 B2 | 12/2016 | Barton et al. | |
| 9,530,841 B1 | 12/2016 | Yang | |
| 9,536,748 B2 | 1/2017 | Berry, III et al. | |
| 9,571,457 B1 | 2/2017 | Hoy et al. | |
| 9,577,142 B2 | 2/2017 | Ishiura | |
| 9,583,567 B2 | 2/2017 | Cohen et al. | |
| 9,590,107 B2 | 3/2017 | Cohen et al. | |
| 9,590,108 B2 | 3/2017 | Campi, Jr. et al. | |
| 9,601,488 B2 | 3/2017 | Waldron et al. | |
| 9,627,479 B2 | 4/2017 | Chen | |
| 9,640,671 B2 | 5/2017 | Pillarisetty et al. | |
| 9,653,361 B2 | 5/2017 | Bae et al. | |
| 9,653,585 B2 | 5/2017 | Zhang | |
| 9,659,829 B1 | 5/2017 | Balakrishnan et al. | |
| 9,666,492 B2 | 5/2017 | Radosavljevic et al. | |
| 2005/0136585 A1* | 6/2005 | Chau .................. | B82Y 10/00 438/214 |
| 2014/0353574 A1* | 12/2014 | Li .................. | H01L 29/0673 257/9 |

* cited by examiner

SELF-ALIGNED NANOTUBE STRUCTURES

FIELD OF THE INVENTION

The present disclosure generally relates to semiconductor structures and, more particularly, to self-aligned nanotube structures and methods of manufacture.

BACKGROUND

To meet increased speed and density of semiconductor devices, new materials and manufacturing methods, such as those for nanotubes, are required. However, nanotube device arrays are limited by forming a regular shape and the ability to place these tubes relatively close together, and at repeatable distances from one another. Further, the manufacturability of nanotubes can be difficult to control.

SUMMARY

In an aspect of the disclosure, a structure comprises: at least one nanotube structure supported by a plurality of spacers and an insulator material between the spacers and contacting the at least one nanotube structure.

In an aspect of the disclosure, a structure comprises: a plurality of fin structures; an aligned nanotube structure between adjacent fin structures of the plurality of fin structures; spacers supporting the aligned nanotube structure between the adjacent fin structures; a material between the spacers and in contact with the aligned nanotube structure between the adjacent fin structures; and epitaxial source and drain regions adjacent to the spacers.

In an aspect of the disclosure, a method comprises: forming fin structures from a substrate material; depositing a liner material over the fin structures and exposed portions of the substrate material; depositing an amorphous material within spaces of the fin structures, which results in void formation between each of the fin structures; annealing the amorphous material to form cavities; forming nanotube structures by filling the cavities with fill material; and forming spacers adjacent to the nanotube structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
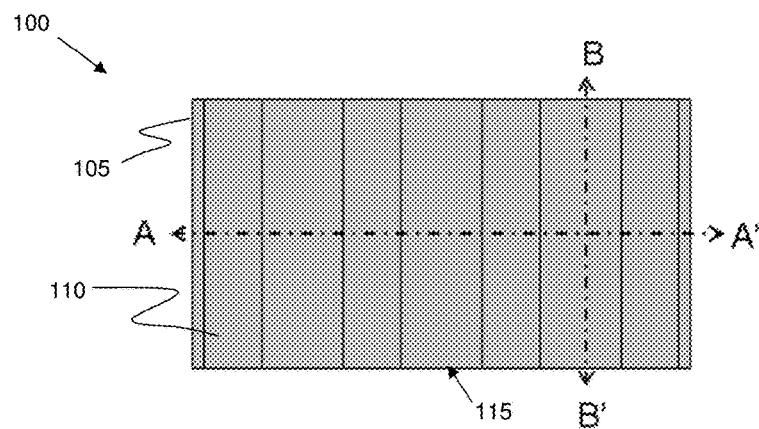
FIGS. 1A-1C show an incoming structure, amongst other features, and respective fabrication processes in accordance with aspects of the present disclosure.

The present disclosure generally relates to semiconductor structures and, more particularly, to self-aligned nanotube structures and methods of manufacture. In embodiments, the nanotube structures are formed from voids between adjacent fin structures. Advantageously, the structures and processes described herein permit scalability in manufacturing at device pitches for current and future technology nodes.

In embodiments, amorphous silicon ($\alpha$-Si) is deposited over fin structures. The deposition process forms a continuous network of voids between the fin structures. Through control of the device features, such as fin width, fin height, fin profile and $\alpha$-Si deposition conditions, voids of different dimensions can be formed. More specifically, by changing the space between the fins, changing the height of the fins and/or changing the profile of the fins, the size of the voids can be modulated, i.e., changed. In embodiments, the voids can be modulated by the deposition process of the $\alpha$-Si material itself. In further embodiments, an annealing process transforms the voids into a network of continuous cavities. The cavities can be filled with various materials for the formation of self-aligned nanotube structures. In this way, the self-aligned nanotube structures can be formed by filling circular cavities which are reshaped from $\alpha$-Si voids in between fins, by an appropriate anneal process.

In embodiments, the cavities can be filled with a carbon nanotube precursor, e.g., graphene, for the formation of carbon nanotubes. In further embodiments, CMOS type materials can be implemented for the formation of CMOS structures, such as tunnel FETS, for example. In even further embodiments, any material which can fill a cavity, e.g., a heterogeneous material such as SiC, GaAs, or other materials from group III and group V on the periodic table, can be implemented in the processes described herein.

The structures and processes provided herein cover the scope for various products, particularly using a channel of current path, including: carbon nanotubes; high-k/MG (Metal Gate) CMOS; III/V devices; silicon nanotubes; metal wires/conductors; and fuses, amongst other examples. The structures and processes provided herein further allow for various benefits including, e.g., providing circular or near circular cavities which are regular and continuous. In addition, by implementing the structures and processes described herein, it is now possible to form regular nanotube networks in repeatable arrays. Additionally, the structures and processes provided herein are Si CMOS technology compatible and scalable to nanometer (nm) technology. Further, the structures and processes provided herein are self-aligned to dummy fin structures.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1B:
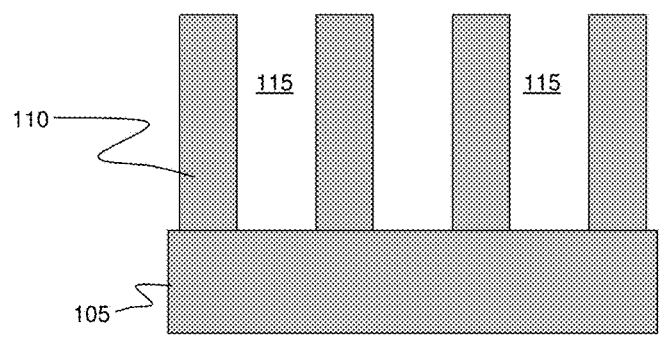
Figure 1C:
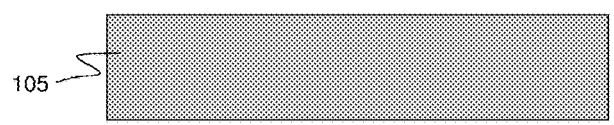

FIGS. 1A-1C show structures and respective fabrication processes in accordance with aspects of the present disclosure. In particular, FIG. 1A illustrates a top view of an initial structure 100, while FIG. 1B illustrates the structure 100 along a cross-section A-A' and FIG. 1C illustrates the structure 100 along a cross-section B-B'. The structure 100 comprises a substrate 105, which can be comprised of various materials. More specifically, the substrate 105 can be any appropriate semiconductor material, e.g., bulk Si, SOL SiGe, SiGeC, SiC, 6H-SiC, GaAs, GaN, GaP, InAs, InN, InP, AlN, AlAs, LiAlO2, sapphire and other III/V or II/VI compound semiconductors.

A plurality of fin structures 110 extend from the substrate 105 and are separated by spaces 115 formed between the fin structures 110. The fin structures 110 can be formed by etching the substrate 105 using conventional patterning processes, e.g., conventional sidewall image transfer (SIT) processes or lithography and etching processes depending on the final width of the fin structures 110. For example, in the SIT technique, a mandrel is formed on the substrate 105 using conventional deposition processes, e.g., chemical vapor deposition (CVD). The mandrel material is different than the substrate 105. A resist is formed on the mandrel material, and exposed to light to form a pattern (openings). A RIE is performed through the openings to form the mandrels. Spacers are formed on the sidewalls of the mandrels which are preferably material that is different than the mandrels, and which are formed using conventional deposition processes known to those of skill in the art. More particularly, the spacers can have a width which matches the dimensions of the fin structures 110. The mandrels are removed or stripped using a conventional etching process, selective to the spacer material. An etching is then performed within the spacing of the spacers to form the sub-lithographic features. The sidewall spacers can then be stripped.

Figure 2A:
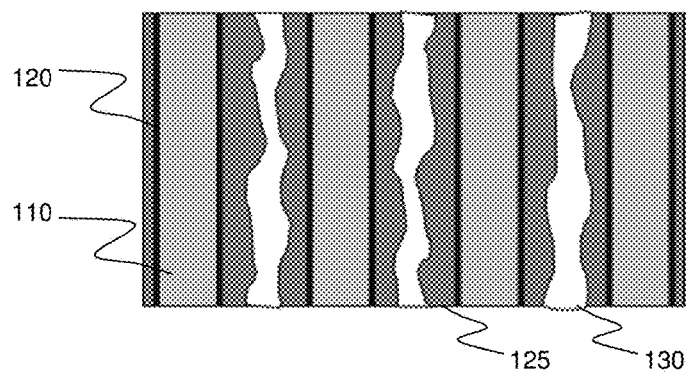
FIGS. 2A-2C show voids between adjacent fin structures, amongst other features, and respective fabrication processes in accordance with aspects of the present disclosure.
Figure 2B:
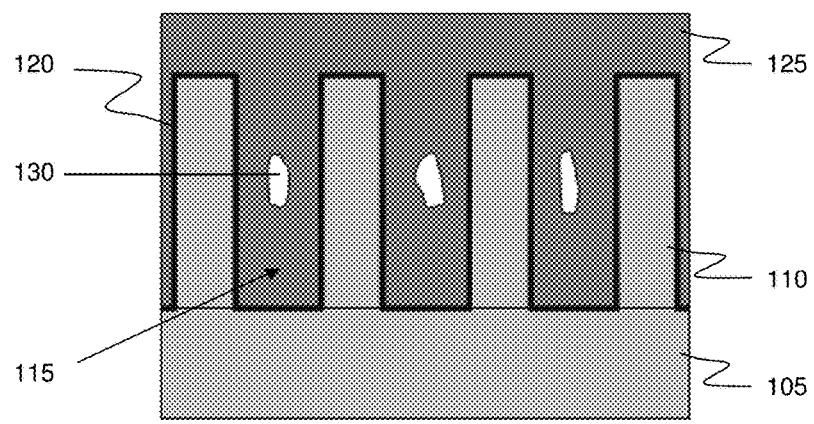
Figure 2C:
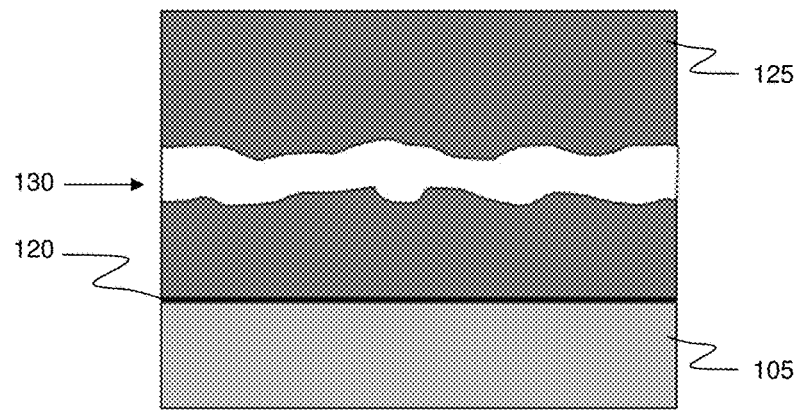

FIGS. 2A-2C illustrate an insulator layer 120 lining the fin structures 110 and within the spaces 115, e.g., lining the substrate 105. In this way, the insulator layer 120 is a liner material deposited over the fin structures 110 and exposed portions of the substrate material 105. In embodiments, the insulator layer 120 is an oxide material deposited using a conventional deposition process, e.g., CVD or ALD. A dummy gate material 125 is formed over the insulator layer 120, using a conventional deposition process, e.g., CVD. In embodiments, the dummy gate material 125 can be a matrix of amorphous silicon (α-Si) material, for example.

A network of voids 130 are formed within and extending through the dummy gate material 125. As should be understood by those of skill in the art, voids 130 can be formed in the dummy gate material 125, e.g., in the spaces 115, during the deposition process, due to a pinch-off phenomenon. In this way, the void formation between each of the fin structures 110 is provided by a pinch off process. More specifically, in embodiments, the voids 130 can be airgaps formed in the α-Si of the dummy gate material 125 by a pinch-off process during the CVD deposition of the α-Si material. In this way, an amorphous material of the dummy gate material 125 is deposited within spaces 115 of the fin structures 110, which results in void formation, i.e., voids 130, between each of the fin structures 110.

In embodiments, the size of the voids 130 can be modulated by changing the features of the surrounding structures. More specifically, the size of the voids 130 can be changed and modulated by changing the space between the fin structures 110, by changing the height or width of the fin structures 110, or by changing the profile of the fin structures 110, amongst other examples. In alternative embodiments, the voids 130 can be modulated by a deposition process, e.g., by the CVD deposition of the α-Si material.

Figure 3A:
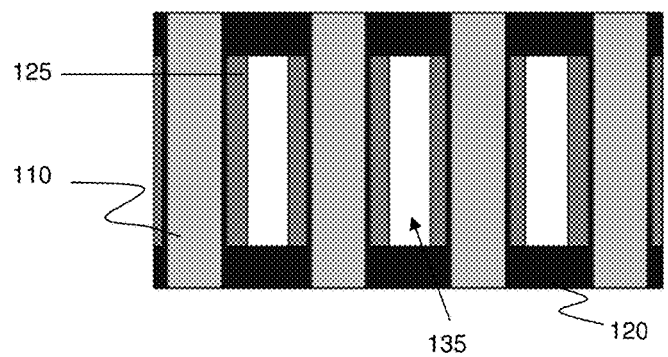
FIGS. 3A-3C show cavities between the adjacent fin structures, amongst other features, and respective fabrication processes in accordance with aspects of the present disclosure.
Figure 3B:
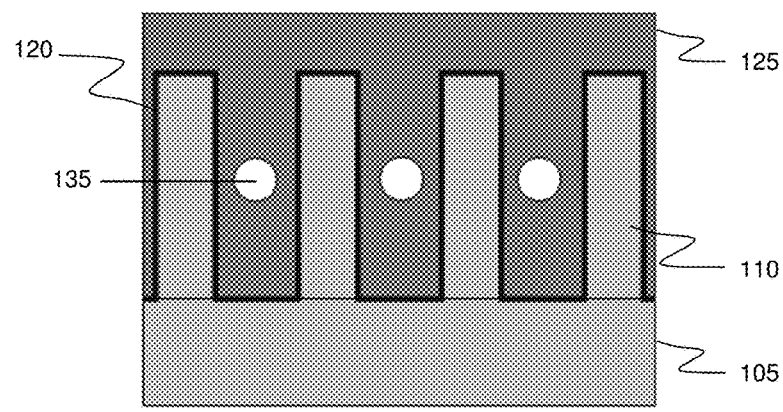
Figure 3C:
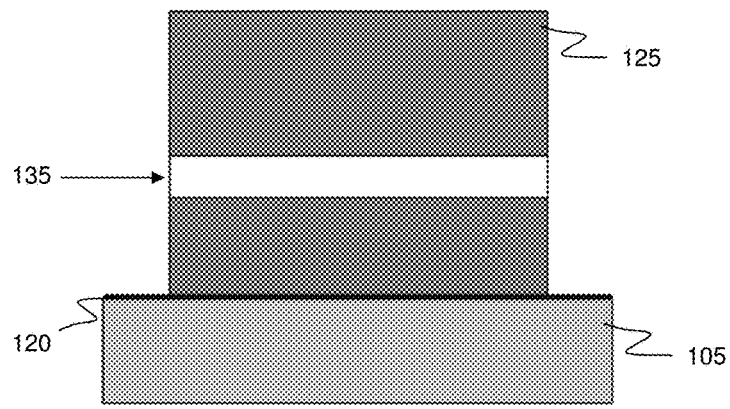

FIGS. 3A-3C show cavities 135 formed from the voids 130 by an annealing process. In embodiments, the annealing process smooths the voids 130, making the cavities 135 less jagged and more circular shaped in comparison to the voids 130. In this way, the amorphous material of the dummy gate material 125 is annealed to form cavities 135 having circular cross-sectional shapes, for example. More specifically, the annealing process is a rapid thermal processing (RTP) type anneal which ramps up and involves the parameters of time, temperature and atmosphere. In embodiments, the RTP anneal can be implemented by the following steps: 1) $N_2$ purging; 2) wafer loading; 3) a first ramping of the temperature up to about 550° C. with a ramp rate of about 10° C./sec; 4) stabilizing at about 550° C. for about 20 seconds; 5) a second ramping of the temperature up to about 800° C. with a ramp rate of about 50° C./sec; 6) soaking the anneal for about 5 seconds at about 800° C.; and 7) ramping down with a ramp rate of 25° C./sec.

Still referring to FIGS. 3A-3C, the dummy gate material 125 is etched in order to cut the cavities 135 into a plurality of self-aligned cavities 135 between the fin structures 110, using conventional lithography and etching processes, e.g., a RIE process. For example, a resist formed over the dummy gate material 125 is exposed to energy (light) to form a pattern (opening). An etching process with a selective chemistry, e.g., reactive ion etching (RIE), selective to the dummy gate material 125 will be used to form one or more trenches in the dummy gate material 125 through the openings of the resist, resulting in self-aligned cavities 135 between the respective fin structures 110. In this way, the ends of each of the self-aligned cavities 135 will be opened. The etching process will also expose portions of the underlying insulator layer 120. The resist can then be removed by a conventional oxygen ashing process or other known stripants. In this way, the cavities 135 are cut prior to the filling of the cavities 135 with a fill material.

Figure 4A:
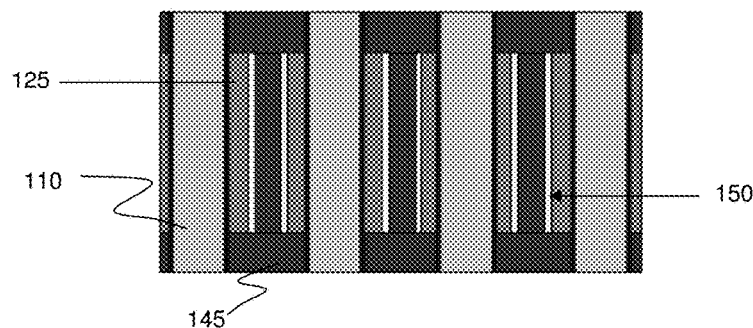
FIGS. 4A-4C show nanotube structures, amongst other features, and respective fabrication processes in accordance with aspects of the present disclosure.
Figure 4B:
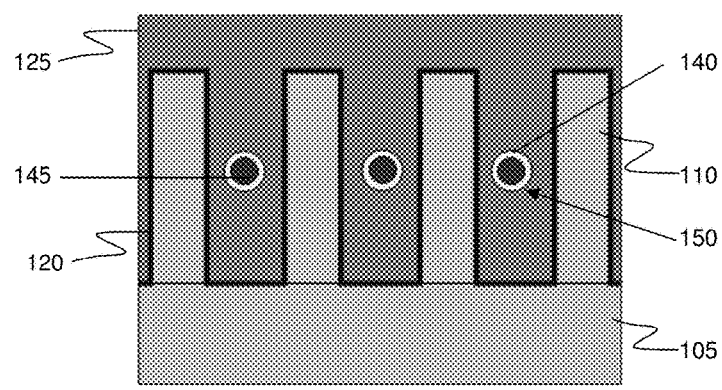
Figure 4C:
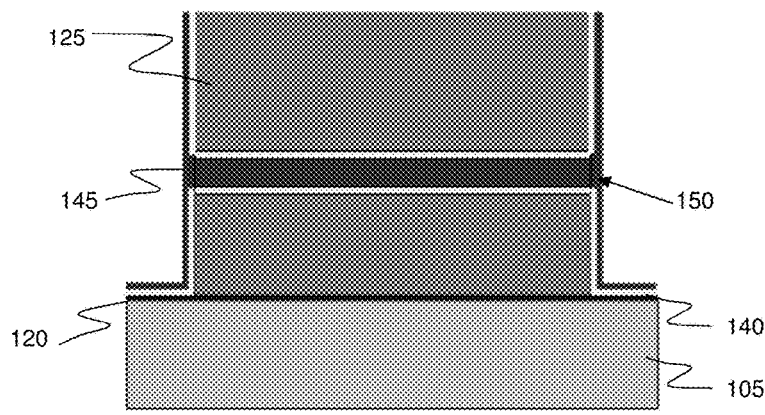

FIGS. 4A-4C show a dielectric material 140 deposited over the dummy gate material 125 and exposed portions of the insulator layer 120, and within the cavities 135 (through the openings of each cut). In this way, the dielectric material 140 will line the cavities 135 as an insulator material. In embodiments, the dielectric material 140 is a high-k dielectric material deposited using conventional processes, e.g., ALD. The high-k dielectric material can be a hafnium based material, amongst other materials suitable as a gate dielectric material. In embodiments, the dielectric material 140 can be relatively thin, e.g., a thickness of about 1.5 nm.

A fill material 145 is deposited over the dielectric material 140 and within the cavities 135 (over the dielectric material 140), forming aligned nanotube structures 150. In this way, the cavities 135 are filled with the filling material 145 so that the aligned nanotube structures 150 are composed of an insulator material and layer in contact with the aligned nanotube structures 150, which is the dielectric material 140, and the fill material 145. In embodiments, the aligned nanotube structures 150 can have any suitable shape. For example, the aligned nanotube structures 150 can have a circular cross-sectional shape, amongst other examples. In embodiments, the aligned nanotube structures 150 are nanotube structures, which are suspended or supported in place initially by the dummy gate material 125. The fill material 145 is any material that can be deposited within the cavity 135 by a conventional deposition process, e.g., ALD. In embodiments, the fill material 145 can be a carbon nanotube precursor material, such as graphene, for the eventual formation of carbon nanotubes. In alternative embodiments, the fill material can be Si or a silicon based material, forming a Si channel. Alternatively, the fill material 145 can be a fiberglass material or a heterogeneous material such as SiG, GaAs, or other materials from group III and group V on the periodic table, amongst other materials. In further alternative embodiments, the fill material 145 can be other CMOS type materials implemented for the formation of CMOS structures, e.g., tunnel FETS. In even further embodiments, the fill material 145 includes an insulator lining and one of a graphene, a silicon material and a heterogeneous material. Following the deposition of the dielectric material 140 and the fill material 145, a polishing process, such as a chemical mechanical polishing (CMP) process, is implemented to remove the dielectric material 140 and the fill material 145 from a top surface of the dummy gate material 125.

The aligned nanotube structures 150 formed in the cavities 135 by the fill material 145 are self-aligned nanotube structures. More specifically, the aligned nanotube structures 150 are self-aligned with respect to the fin structure 110, i.e., within the dummy gate material 125; that is, the aligned nanotube structures 150 are provided and positioned between the adjacent fin structures of the plurality of fin structures 110. In embodiments, the aligned nanotube structures 150 can have various dimensions. For example, the aligned nanotube structures 150 can have a length in a range of 10 nm to 200 nm for example. In embodiments, the cavity 135 can have a diameter of about 10 nm, for example. In this way, the aligned nanotube structures 150 can have a thickness of 3 nm to 50 nm, amongst other examples. It is contemplated herein that the aligned nanotube structures 150 can be manufactured to other dimensions, based on the tooling and materials implemented.

Figure 5A:
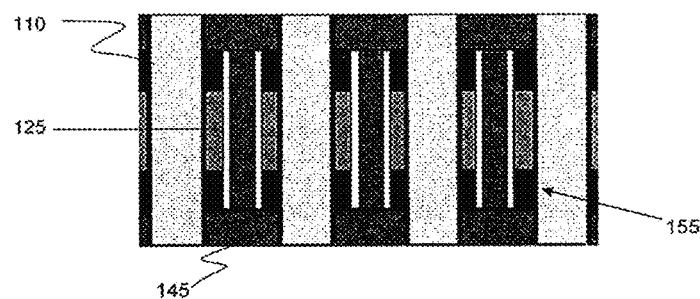
FIGS. 5A-5C show trenches, amongst other features, and respective fabrication processes in accordance with aspects of the present disclosure.
Figure 5B:
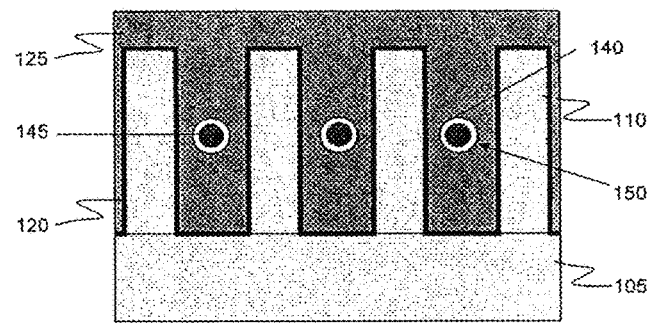
Figure 5C:
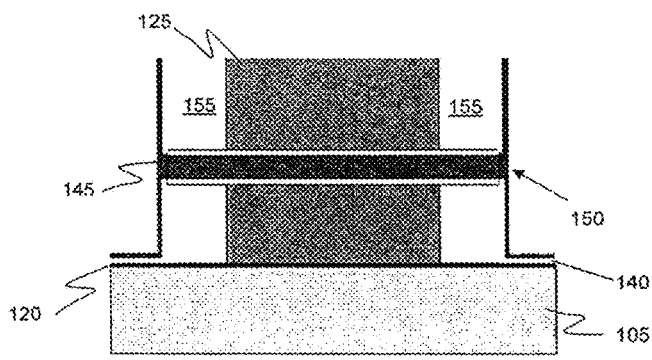

FIGS. 5A-5C show an etching of the dummy gate material 125 in preparation for spacer material. In particular, the dummy gate material 125 is etched to form trenches 155 at ends of the aligned nanotube structures 150, using conventional lithography and etching processes, e.g., a RIE process. For example, a resist formed over the dummy gate material 125 is exposed to energy (light) to form a pattern (opening). An etching process with a selective chemistry, e.g., reactive ion etching (RIE), selective to the dummy gate material 125 will be used to form one or more trenches 155 in the dummy gate material 125 through the openings of the resist. The etching process will expose portions of the underlying insulator layer 120 and portions of the aligned nanotube structures 150. The resist can then be removed by a conventional oxygen ashing process or other known stripants.

Figure 6A:
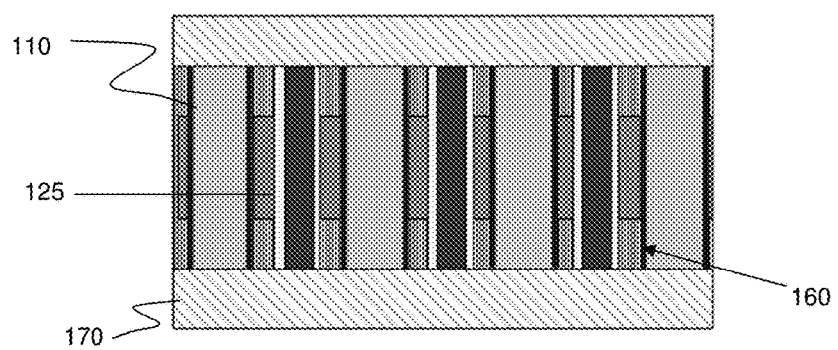
FIGS. 6A-6C show spacers, amongst other features, and respective fabrication processes in accordance with aspects of the present disclosure.
Figure 6B:
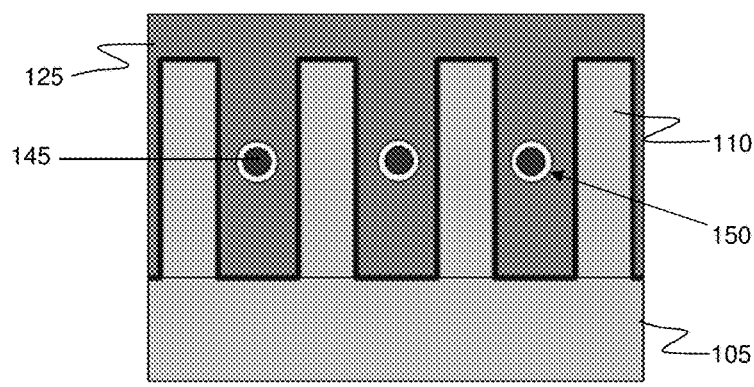
Figure 6C:
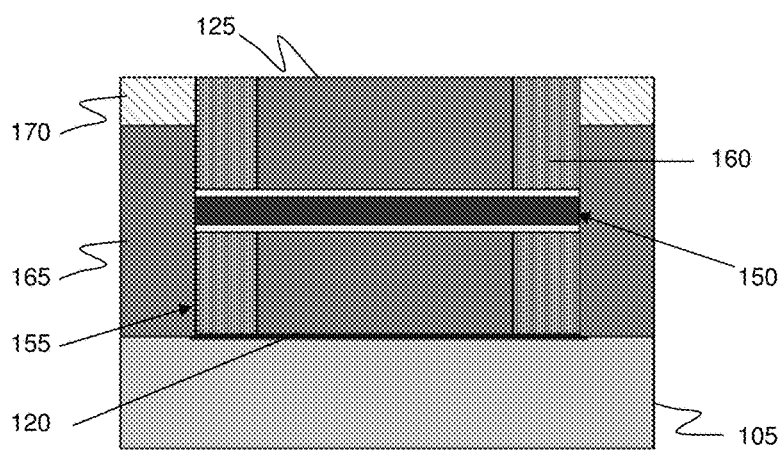

FIGS. 6A-6C show spacers 160 formed in the trenches 155 and adjacent to the aligned nanotube structures 150, and more particularly about the exposed portions of the aligned nanotube structures 150. The spacers 160 can be deposited by a blanket deposition, e.g., CVD process, over the dummy gate material 125 and the aligned nanotube structures 150. In embodiments, the spacers 160 can be nitride or oxide based material, which will suspend or support the aligned nanotube structures 150 at, preferably, end portions thereof. In embodiments, the spacers 160 support the aligned nanotube structures 150 between the adjacent fin structures 110. It should be recognized by those of skill in the art that the spacers 160 can suspend or support the aligned nanotube structures 150 at other locations, depending on the location of the finalized gate structures. Further, the spacers 160 are self-aligned with assistance from the sidewall of the trenches 155 in order to be in self-alignment, which allow the spacers 160 to be aligned with later formed contacts. The spacers 160 also provide isolation for the later formed contacts from the later formed gate structure. The spacers 160 can be etched back, e.g., an isotropic etching process, to remove any excess spacer material. In embodiments, the spacer material is etched using conventional lithography and etching processes, e.g., a RIE process.

An epitaxial (epi) material 165 is grown from the semiconductor material, i.e., the substrate 105, to form source and drain regions. In embodiments, the epi material 165 can be Si or SiGe, amongst other examples, grown on sides of the spacers 160. In this way, the epitaxial source and drain regions are adjacent to the spacers 160. To grow the epi material 165, a mask can be used to prevent growth of epitaxial material 165 on any unwanted regions of the device, e.g., any exposed semiconductor material. In this way, the epitaxial material 165 can be grown on the substrate 105 only in the source/drain (S/D) regions. As shown in FIG. 6C, the epitaxial material 165 forms source and drain regions adjacent to respective spacers 160 and in contact with end portions of the aligned nanotube structure 150. An insulator layer 170 can be deposited using conventional deposition processes, e.g., CVD, over the epitaxial material 165, followed by a polishing process, e.g., CMP.

Figure 7A:
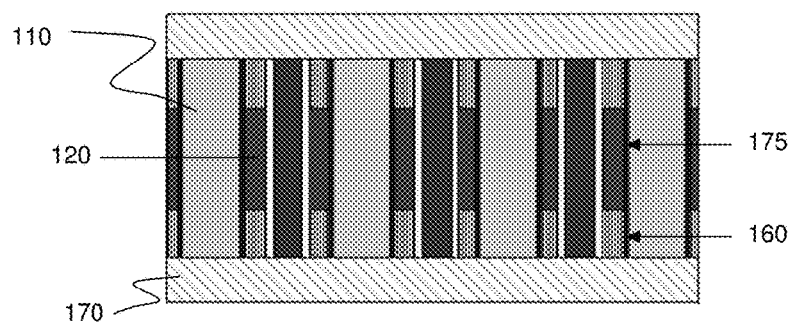
FIGS. 7A-7C show trenches, amongst other features, and respective fabrication processes in accordance with aspects of the present disclosure.
Figure 7B:
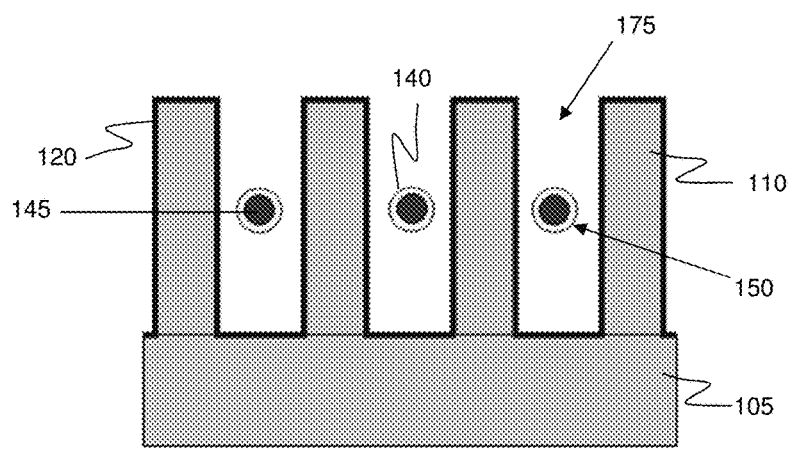
Figure 7C:
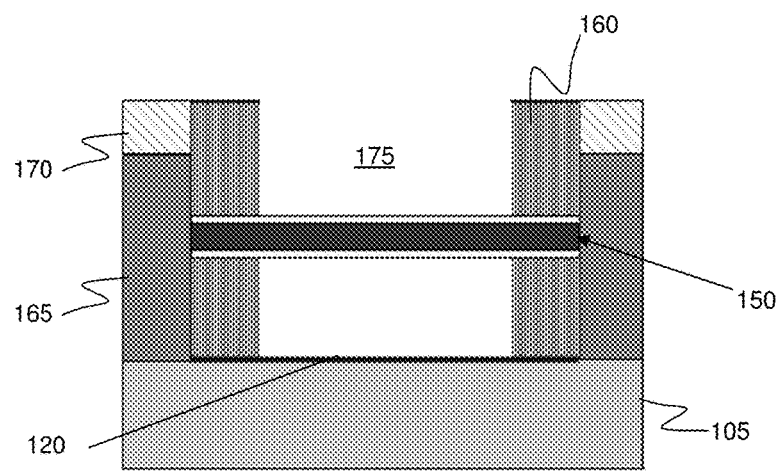

In FIGS. 7A-7C, the dummy gate material 125 is removed, i.e., the sacrificial gate, forming trench 175 and exposing the remaining underlying insulator layer 120 and the aligned nanotube structures 150. In embodiments, the dummy gate material 125 is etched using conventional lithography and etching processes, e.g., a RIE process. The dummy gate material 125 is removed for the subsequent formation of the gate structure, about the aligned nanotube structures 150. In embodiments, the aligned nanotube structures 150 will be held in place and supported by the spacers 160.

Figure 8:
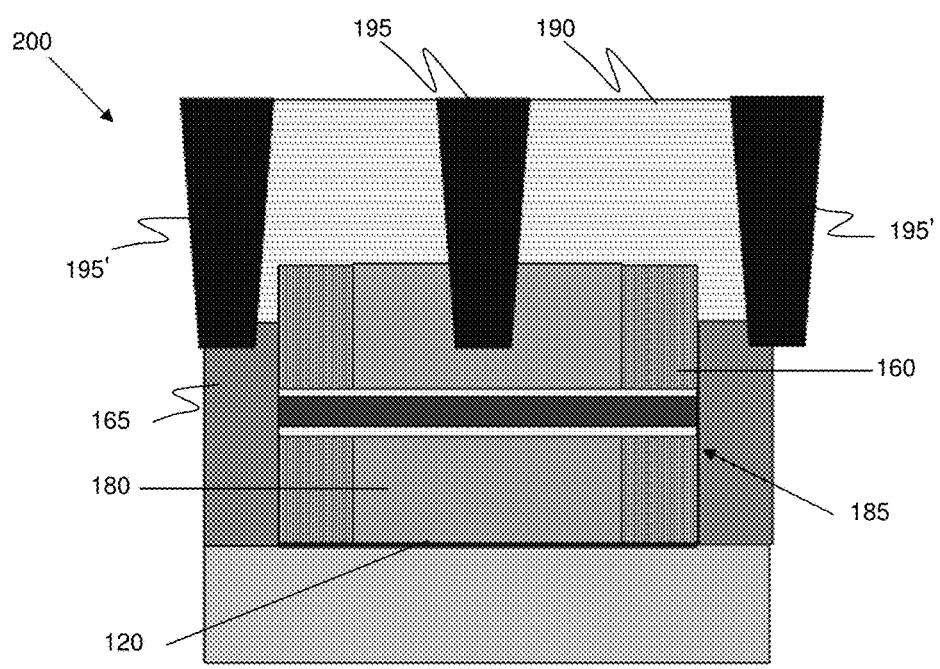
FIG. 8 show a device, amongst other features, and respective fabrication processes in accordance with aspects of the present disclosure.

FIG. 8 shows a structure 200 with a gate structure 185, which includes a gate material 180 deposited within the trench 175 and about the aligned nanotube structures 150. The gate structure 185 can be formed by a gate-last process, e.g., replacement metal gate process. In embodiments, the gate structure 185 can be a gate-all-around FET device, for example, surrounding the aligned nanotube structures 150 and between the spacers 160. In this way, the gate material 180 surrounds the aligned nanotube structure 150 to form an all-around gate structure, i.e., the gate structure 185. That is, the gate material 180 is formed about the aligned nanotube structures 150 between the spacers 160 and epitaxial source and drain regions, i.e., epi materials 165, on sides of the spacers 160.

The gate material 180 can deposited using conventional processes, e.g., a plasma enhanced CVD (PEVCD) process. The gate material 180 can be various materials, such as a poly-Si or a workfunction metal, amongst other examples. The workfunction metal of the gate material 180 can be any metal or combination of metals for a transistor, e.g., PFET and/or NFET, depending on the particular application and design parameters. A Ti, TiN, Ta, TaN, etc. material can be used as the workfunction metal, followed by a conductive gate metal. For example, in embodiments, the conductive gate metal can be a tungsten (W) material. In embodiments, the aligned nanotube structures 150 are supported by the plurality of spacers 160 and the gate material 180 between the spacers 160 and contacting the aligned nanotube structures 150. In further embodiments, the gate material 180 surrounds the aligned nanotube structures 150. In this way, the gate material 180 is between the spacers 160 and in contact with the aligned nanotube structure 150 between the adjacent fin structures 110.

An insulator layer 190 is deposited over the gate structure 185 and the epi materials 165. In embodiments, the insulator layer 190 can be etched to form trenches, exposing the underlying the S/D regions, i.e., the epi materials 165 and the gate material 180. A metal material can then be deposited by CVD within the trenches directly on the epi materials 165 and the gate material 180, followed by a planarization process to the insulator layer 190, e.g., CMP, to form the gate contact 195 and the S/D contacts 195' and wiring layers.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising at least one nanotube structure between adjacent fin structures and supported by a plurality of spacers, and an insulator material between the spacers which contacts the spacers at a bottom surface thereof, the spacers and the insulator material lining the adjacent fin structures.

2. The structure of claim 1, further comprising a gate material formed around the insulator material, wherein the insulator material is a gate dielectric material which surrounds the at least one nanotube structure.

3. The structure of claim 1, wherein the at least one nanotube structure is composed of another insulator material and a fill material.

4. The structure of claim 3, wherein the fill material is a group III or group V material.

5. The structure of claim 3, wherein the fill material is graphene.

6. The structure of claim 3, wherein the fill material is a silicon based material.

7. The structure of claim 3, wherein the insulator material lines the adjacent fin structures and exposed portions of the substrate material.

8. The structure of claim 3, further comprising epitaxial source and drain regions adjacent to respective spacers and in contact with end portions of the at least one nanotube structure.

9. The structure of claim 8, further comprising a gate-all-around FET which comprises a gate material surrounding the at least one nanotube structure between the spacers.

10. The structure of claim 9, wherein the epitaxial source and drain regions are directly on sides of the spacers.

11. The structure of claim 10, wherein the gate material supports the at least one nanotube structure.

12. The structure of claim 11, wherein the gate material is in direct contact with the at least one nanotube structure.

13. The structure of claim 12, further comprising a cavity in which the at least one nanotube structure is formed therein.

14. The structure of claim 13, wherein the cavity is lined with the insulator material.

15. The structure of claim 14, wherein the cavity is filled with the fill material.

16. A structure, comprising:
a plurality of fin structures;
an aligned nanotube structure between adjacent fin structures of the plurality of fin structures;
spacers supporting the aligned nanotube structure between the adjacent fin structures;
a material lining the plurality of fin structures which is between and in contact with the spacers between the adjacent fin structures; and
epitaxial source and drain regions adjacent to the spacers and directly on sides of the spacers.

17. The structure of claim 16, wherein the aligned nanotube structure includes a fill material.

18. The structure of claim 17, wherein the fill material is one of graphene, a heterogeneous material and a silicon material.

19. The structure of claim 16, further comprising a gate material surrounding the material and the aligned nanotube structure to form an all-around gate structure, the material being a gate dielectric material.

20. The structure of claim 16, wherein the aligned nanotube structure has a circular cross-sectional shape.

* * * * *